(12) United States Patent
Chen

(10) Patent No.: US 6,646,309 B1
(45) Date of Patent: Nov. 11, 2003

(54) ELECTROSTATIC DISCHARGE TRIGGER

(75) Inventor: Chung-Hui Chen, Hsin Chu (TW)

(73) Assignee: Taiwan Semiconductor Manufacturing Co. Ltd., Hsin Chu (TW)

(*) Notice: Subject to any disclaimer, the term of this patent is extended or adjusted under 35 U.S.C. 154(b) by 0 days.

(21) Appl. No.: 10/272,628

(22) Filed: Oct. 17, 2002

(51) Int. Cl.[7] .................... H01L 23/62; H01L 29/76; H01L 29/94; H01L 31/062; H01L 31/113
(52) U.S. Cl. .................... 257/358; 257/357; 257/360; 257/361; 257/363; 257/364
(58) Field of Search ................ 257/357, 358, 257/359, 360, 361, 362, 363

(56) References Cited

U.S. PATENT DOCUMENTS

| | | | |
|---|---|---|---|
| 6,078,083 A | * 6/2000 | Amerasekera et al. | 257/358 |
| 6,501,632 B1 | * 12/2002 | Avery et al. | 361/111 |
| 2002/0149059 A1 | * 10/2002 | Ker et al. | 257/355 |
| 2002/0154462 A1 | * 10/2002 | Ker et al. | 361/56 |
| 2002/0154463 A1 | * 10/2002 | Mergens et al. | 361/56 |

* cited by examiner

Primary Examiner—Ngan V. Ngo
(74) Attorney, Agent, or Firm—Tung & Associates

(57) ABSTRACT

Employing an electrostatic discharge (ESD) trigger to trigger the MOS transistors (i.e., the ESD fingers) within a CMOS device to provide substantially more uniform turn-on voltages for the MOS transistors, resulting in better ESD device performance without employing selective salicide blocking, is disclosed. A semiconductor device has an ESD trigger and a number of ESD fingers. The turn on voltage of the ESD trigger is less than the turn on voltage of the ESD fingers, such that the ESD fingers turn on substantially uniformly after the ESD trigger turns on during an ESD event. The semiconductor device is substantially fabricated without employing salicide blocking.

15 Claims, 4 Drawing Sheets

ELECTROSTATIC DISCHARGE TRIGGER

FIELD OF THE INVENTION

This invention relates generally to semiconductor MOS technology, such as CMOS, and more particularly to preventing electrostatic discharge (ESD) event-related problems within semiconductor devices using such MOS technology.

BACKGROUND OF THE INVENTION

Salicide is widely used in deep sub-micron CMOS technology to lower the sheet resistance of the polysilicon resistors and the MOS junction sources and drains of CMOS devices. Without employing selective salicide blocking, however, the electrostatic discharge (ESD) performance of full salicide CMOS semiconductor devices is jeopardized. Selective salicide blocking includes utilizing a salicide blocking mask to remove salicide from the source and drain of the NMOS channel of such a device. Without using such salicide blocking, however, the resulting CMOS device has non-uniform turn-on behavior between the fingers of the device, causing thermal runaway at the MOS channel of the device.

It is known that adding a ballast resistor between the bonding pad and the drain of the NMOS transistor can increase the uniformity of the turn-on voltage (i.e., breakdown voltage) for the parasitic, npn-bipolar junction transistor (BJT) underneath the NMOS channel. Removing the salicide from the drain of the NMOS transistor creates such a ballast resistor, increasing the uniformity of the turn-on voltages of the parasitic npn-BJT's between the fingers. Blocking the salicide on the drain area can increase the effective collector area of the parasitic npn-BJT underneath the NMOS channel. Employing a salicide blocking mask to remove the salicide from the drain of the NMOS channel is thus helpful in bettering ESD performance.

The prior art teaches that this can be accomplished by using a multi-finger turn-on (MFT) technique. This technique teaches inserting salicide polysilicon resistors between the sources of the NMOS channels and ground, to ensure that all fingers are triggered in the case of an ESD event. However, insertion of such resistors is disadvantageous. The sheet resistance of the salicide polysilicon resistor, for instance, may change after the occurrence of an ESD event, causing a corresponding change in the devices' current-voltage (I-V) curve. For this reason, as well as other reasons, there is a need for the present invention.

SUMMARY OF THE INVENTION

The invention relates to employing an electrostatic discharge (ESD) trigger to trigger the MOS transistors (i.e., the ESD fingers) within a CMOS device to provide substantially more uniform turn-on voltages for the MOS transistors, resulting in better ESD device performance without employing selective salicide blocking. A semiconductor device of an embodiment of the invention has an ESD trigger and a number of ESD fingers. The turn on voltage of the ESD trigger is less than the turn on voltage of the ESD fingers, such that the ESD fingers turn on substantially uniformly after the ESD trigger turns on during an ESD event. The semiconductor device is substantially fabricated without employing salicide blocking.

Embodiments of the invention provide for advantages not found within the prior art. ESD protection is achieved by the invention without utilizing salicide blocking in semiconductor devices having salicide. Thus, the disadvantages associated with utilizing salicide blocking as in the prior art are avoided. That is, the sheet resistance of the salicide polysilicon resistor of the device preferably does not deviate after the occurrence of an ESD event, such that the device's current-voltage (I-V) curve also does not deviate after the occurrence of the ESD event. Still other aspects, embodiments, and advantages of the invention will become apparent by reading the detailed description that follows, and by referring to the accompanying figures.

BRIEF DESCRIPTION OF THE DRAWINGS

The drawings referenced herein form a part of the specification. Features shown in the drawing are meant as illustrative of only some embodiments of the invention, and not of all embodiments of the invention, unless otherwise explicitly indicated, and implications to the contrary are otherwise not to be made.

DETAILED DESCRIPTION OF THE INVENTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Figure 1:
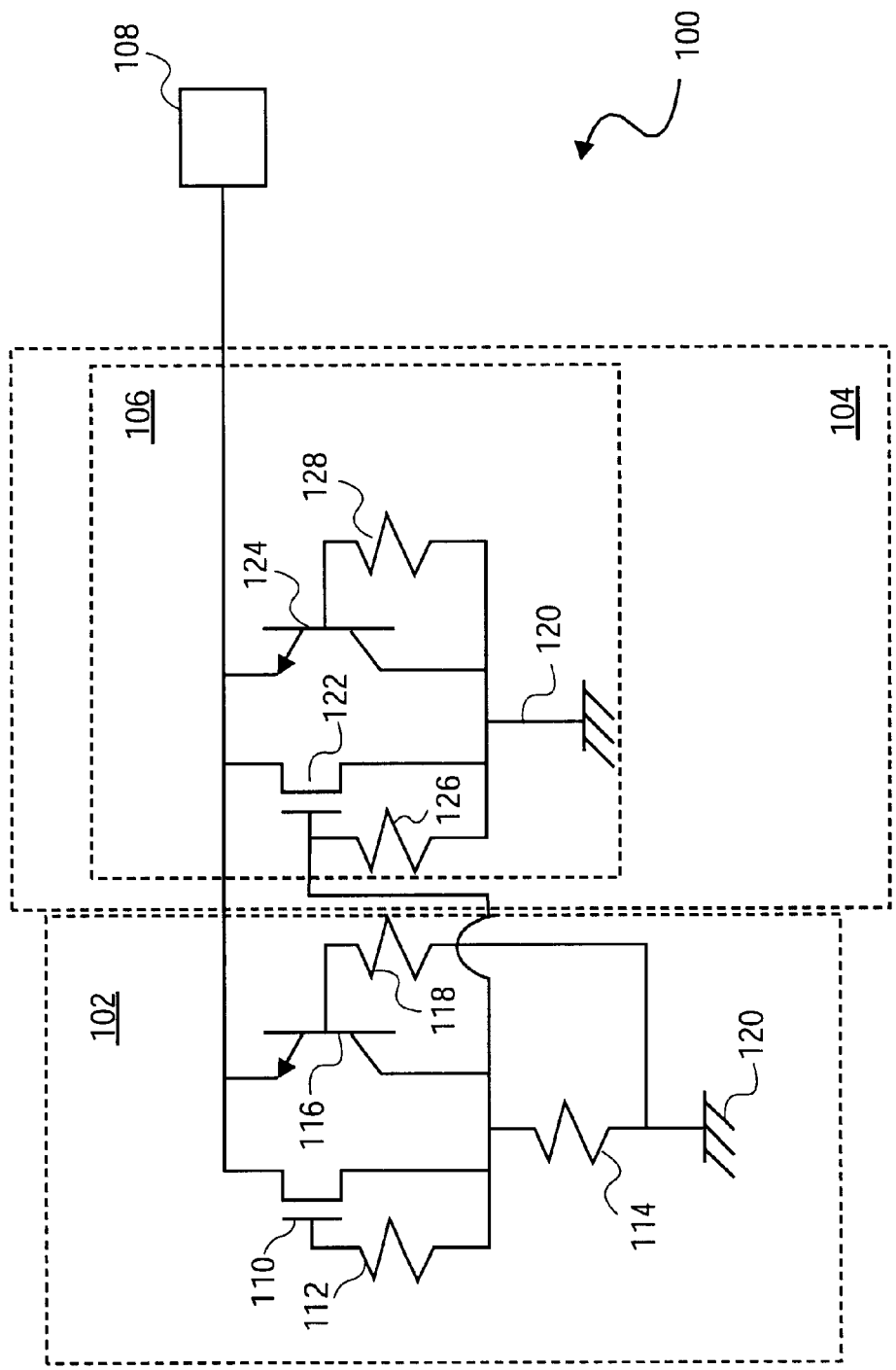
FIG. 1 is a diagram of a semiconductor electrostatic discharge (ESD) protection device, according to an embodiment of the invention, having an ESD trigger and a number of ESD fingers made up of MOS transistors.

FIG. 1 shows a semiconductor electrostatic discharge (ESD) protection device 100, according to an embodiment of the invention. The device 100 preferably is a CMOS device having salicide to lower sheet resistance of a polysilicon resistor of the device, and of sources and drains of MOS transistors of the device. The device 100 includes an ESD trigger 102, and a number of ESD fingers 104. The ESD fingers 104, for instance, include the ESD finger 106, where only the ESD finger 106 of the ESD fingers 104 is shown in FIG. 1 for illustrative clarity, as can be appreciated by those of ordinary skill within the art. Both the ESD trigger 102 and the ESD fingers 104 are coupled to a pad 108 of the device, which allows for external connection or coupling to the semiconductor device 100.

The ESD trigger 102 has a MOS transistor 110 (such as an NMOS transistor), a resistor 112, a resistor 114, a parasitic npn-bipolar junction transistor (BJT) 116, and a (effective) resistor 118 configured in relation to the ground 120 as shown in FIG. 1. Similarly, the ESD finger 106 has a MOS transistor 122 (such as an NMOS transistor), a parasitic npn-BJT 124, a resistor 126, and a (effective) resistor 128 configured in relation to the ground 120 as shown in FIG. 1. Other of the ESD fingers 104 are preferably identical to the ESD finger 106 of the ESD fingers 104.

The MOS transistor 110 of the ESD trigger 102 has a shorter channel length than the channel length of the MOS transistor 122 of the ESD finger 106, as well as the channel lengths of the MOS transistors of other of the ESD fingers 104. This results in the MOS transistor 110 having a lower turn on voltage, or breakdown voltage, than the MOS transistor 122 does. Thus, the ESD trigger 102 will be triggered before the ESD fingers 104 do during the occurrence of an ESD event, where the ESD fingers 104 substantially provide the ESD protection of the device 100. That is, the ESD fingers 104 are used to conduct the substantially large ESD charge.

Figure 2:
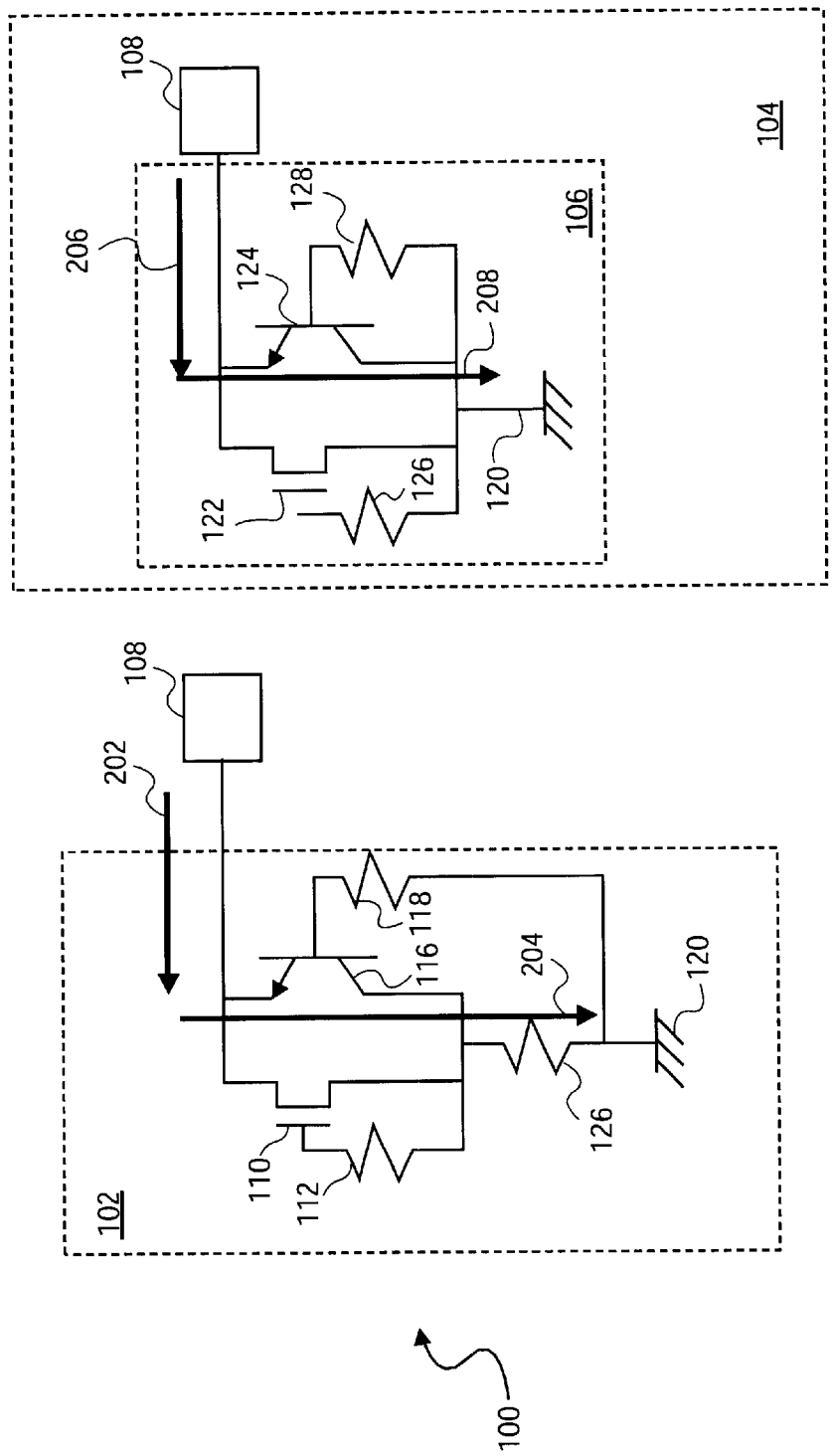
FIG. 2 is a diagram showing the ESD operation of the semiconductor device of FIG. 1, according to an embodiment of the invention, in which the ESD trigger of the device uniformly turns on the ESD fingers of the device.

FIG. 2 shows the operation of the device 100, according to an embodiment of the invention. The ESD charge during occurrence of the ESD event first travels from the pad 108 through the ESD trigger 102, and to the ground 120, as indicated by the arrows 202 and 204. The ESD trigger 102 preferably activates all the ESD fingers 104. As a result, the ESD charge can clamp at a relatively very low voltage. The ESD charge thus travels from the pad 108 through the ESD fingers 104, such as the ESD finger 106, and to the ground 102, as indicated by the arrows 206 and 208. Because all the ESD fingers 104 activate at the same time, the non-uniform turn-on behavior described in the background is substantially totally eliminated. Therefore, selective salicide blocking, as performed in the prior art as described in the background, can be omitted.

Figure 3:
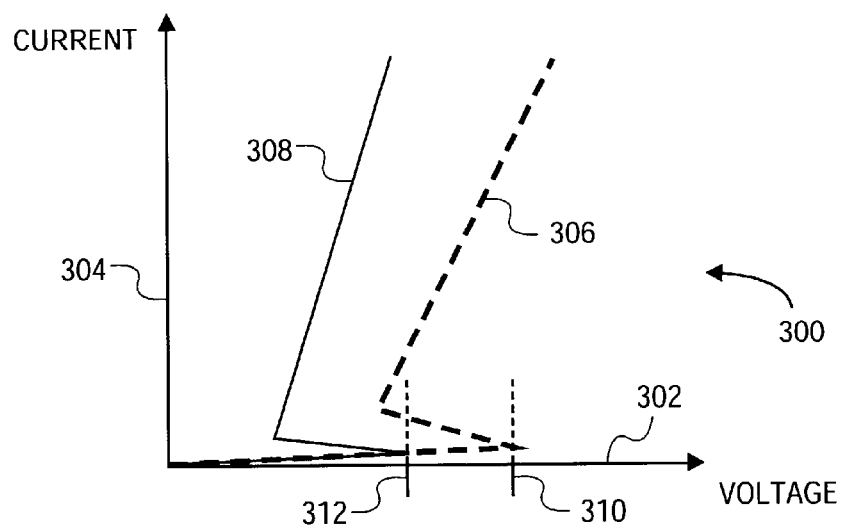
FIG. 3 is a current-voltage (I-V) graph showing the different turn-on voltages of the ESD trigger and the ESD fingers of the device of FIGS. 1 and 2, according to an embodiment of the invention.

FIG. 3 shows a graph 300 illustrating the relative turn on, or breakdown, voltages of the ESD trigger 102 and the ESD fingers 104, according to an embodiment of the invention. The graph 300 measures the current 304 as a function of the voltage 302, such that the graph 300 is a current-voltage (I-V) graph. The dotted line 306 is the I-V curve for the ESD fingers 104, such as the ESD finger 106, whereas the solid line 308 is the I-V curve for the ESD trigger 102. Thus, the turn on voltage for the ESD trigger 102, indicated by the dotted line 312, is less than the turn on voltage for the ESD fingers 104, indicated by the dotted line 310. This means that the ESD trigger 102 turns on before the ESD fingers 104, and that the former preferably activates the latter.

Figure 4:
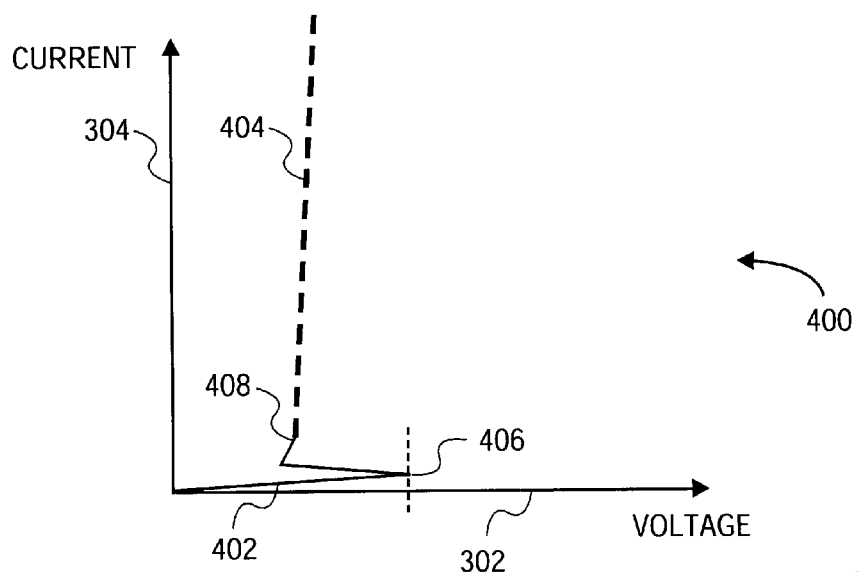
FIG. 4 is an I-V graph showing how the ESD trigger of the device of FIGS. 1 and 2 initially turns on during an ESD event, which subsequently turns on the ESD fingers of the device of FIGS. 1 and 2 at uniform turn-on voltages to provide ESD protection, according to an embodiment of the invention.

FIG. 4 shows a graph 400 illustrating the operation of the semiconductor device 100, according to an embodiment of the invention. Like the graph 300 of FIG. 3, the graph 400 measures the current 304 as a function of the voltage 302, such that the graph 400 is an I-V graph. In the occurrence of an ESD event, the ESD trigger 102 is first activated, indicated by the solid line 402 culminating in a voltage greater than the turn on voltage of the ESD trigger 102, which itself is indicated by the dotted line 406. Thereafter, the ESD trigger 102 preferably turns on the ESD fingers 104, such as the ESD finger 106, such that ultimately the turn voltage of the ESD fingers 104 is exceeded, indicated by the reference number 408. The ESD fingers 104 then absorb the ESD charge, as at least tangentially indicated by the dotted line 404.

In one embodiment, the channel length of the MOS transistor 110 of the ESD trigger 102 can be 0.35 micron, whereas the channel length of the MOS transistor 122 of the ESD finger 106 (as well as the MOS transistors of other of the ESD fingers 104) can be 0.4 micron. Furthermore, where the transistors 110 and 122 are NMOS transistors, the p-substrate, or p-well, contact of the transistor 110 can be located farther than the p-substrate, or p-well, contact of the transistor 122. This makes the resistance of the effective resistor 118 of the ESD trigger 102 larger than the resistance of the effective resistor 128 of the ESD finger 106. Since the channel length of the transistor 110 is smaller than the channel length of the transistor 122, the base width of the parasitic npn-BJT 116 of the ESD trigger 102 is shorter than that of the parasitic npn-BJT 124 of the ESD finger 106.

For this reason, then, the thermal breakdown, or turn on, voltage of the BJT 116 of the ESD trigger 102 can be smaller than the thermal breakdown, or turn on, voltage of the BJT 124 of the ESD finger 106. Thus, the transistor 110 of the ESD trigger 102 can be always quicker than the transistor 122 of the ESD finger 106, to ensure that all the ESD fingers 104, including the ESD finger 106, are turned on during the occurrence of an ESD event. Moreover, to prevent the transistor 110 of the ESD trigger 102 from damage during the occurrence of the ESD event before the ESD fingers 104 turn on, preferably the resistor 114 of the ESD trigger 102 is larger than the resistor 126 of the ESD finger 106. Thus, all the ESD fingers 104 turn on before the transistor 110 of the ESD trigger 102 is over stressed.

The in-series resistor 114 of the ESD trigger 102 does not only trigger all the ESD fingers 104 in one embodiment, but also limits the current through the ESD trigger 102, protecting the transistor 110 from damage. Furthermore, in one embodiment the resistance of the resistor 114, plus the resistance of the resistor 126, equal 300 ohms. The input/output (I/O) size of the semiconductor device 100 may be 35 micron by 140 micron, where the transistor 110 has a total length of 2.5 micron, and the transistor 122 has a total length of 3.0 micron.

Figure 5:
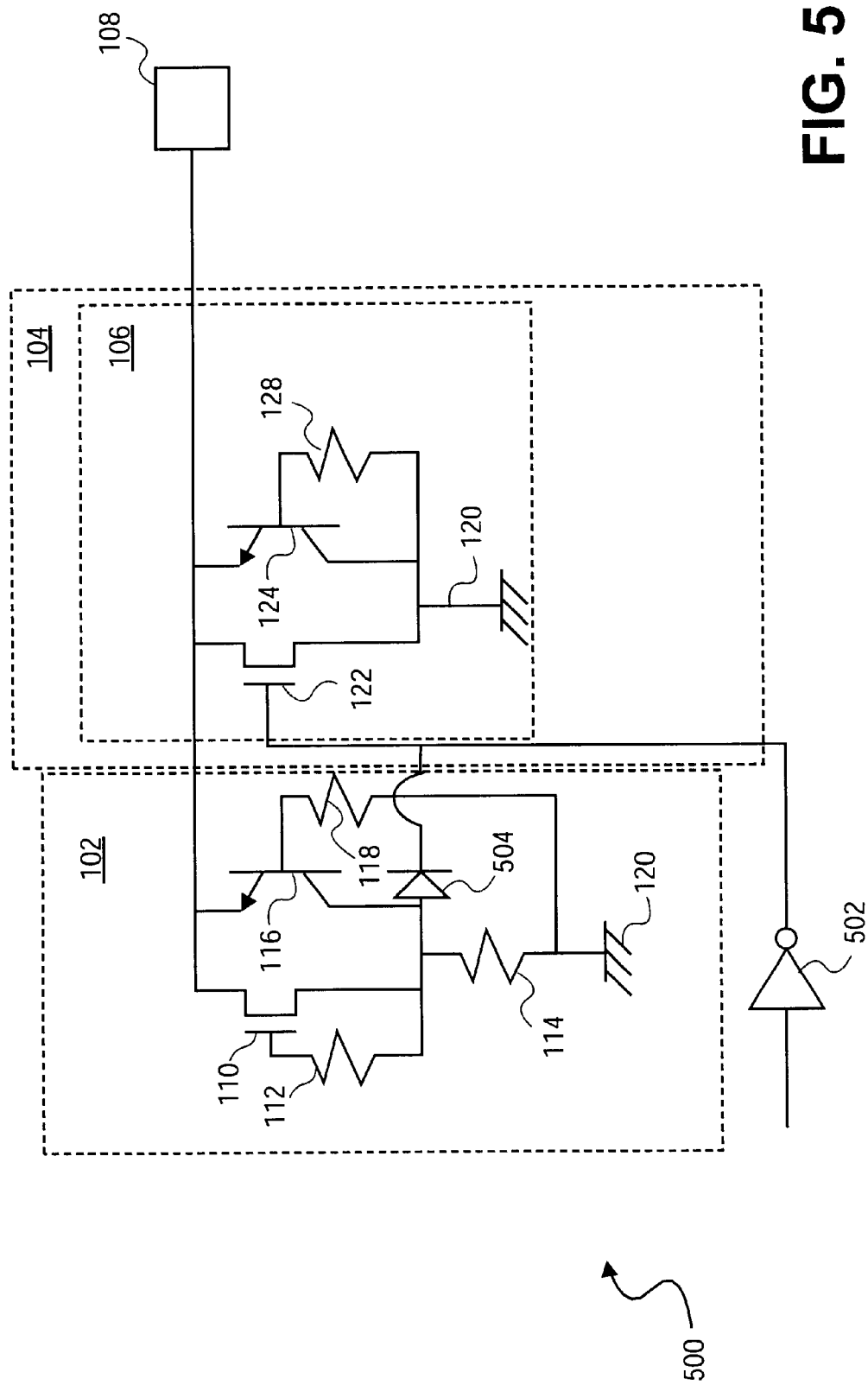
FIG. 5 is a diagram of a semiconductor driver device having ESD protection, in accordance with an embodiment of the invention.

The invention has been thus far described in relation to a semiconductor ESD protection device 100. However, the invention can be extended in one embodiment to a semiconductor driver device having ESD protection. FIG. 5 shows such a semiconductor driver device 500, according to an embodiment of the invention. The ESD protection of the device 500 operates substantially the same as that of the device 100 of FIG. 1, as has been described. The device 500 has substantially the same components as those of the device 100, with the addition of an inverter 502 and a diode 504, configured as indicated in FIG. 5.

The inverter 502 is driven by a pre-driver control signal. The diode 504 is added to prevent the ESD trigger pulling the gate of the transistor 122 down to the ground 120 during normal operation. During the occurrence of an ESD event, the transistor 110 of the ESD trigger 102 still turns on first, and causes the gate of the transistor 122 of the ESD finger 106 to pull high through the diode 504. Thus, all the ESD fingers 104, including the ESD finger 106, are still turned on uniformly. Therefore, salicide blocking can be omitted from the device 500 as well as the device 100, while still providing high ESD protection.

It is noted that, although specific embodiments have been illustrated and described herein, it will be appreciated by those of ordinary skill in the art that any arrangement is calculated to achieve the same purpose may be substituted for the specific embodiments shown. This application is intended to cover any adaptations or variations of the present invention. Therefore, it is manifestly intended that this invention be limited only by the claims and equivalents thereof.

What is claimed is:

1. A CMOS semiconductor device having salicide to lower sheet resistance of a polysilicon resistor, and of sources and drains of MOS transistors, of the CMOS semiconductor device, the CMOS semiconductor device further comprising:

an electrostatic discharge (ESD) trigger having a first turn-on voltage; and, a plurality of ESD fingers having a second turn-on voltage greater than the first turn-on voltage such that the ESD fingers turn on substantially uniformly after the ESD trigger turns on during an ESD event, the semiconductor device substantially fabricated without employing salicide blocking.

2. The semiconductor device of claim 1, wherein the ESD trigger has a shorter channel length than channel lengths of the ESD fingers.

3. The semiconductor device of claim 1, wherein each of the ESD trigger and the ESD fingers comprises a MOS transistor.

4. The semiconductor device of claim 1, wherein the ESD trigger turns on the ESD fingers during the ESD event.

5. The semiconductor device of claim 1, wherein the ESD fingers substantially provide the ESD protection for the semiconductor device.

6. The semiconductor device of claim 1, wherein the device is an ESD protection device.

7. The semiconductor device of claim 1, wherein the device is a driver having ESD protection.

8. The semiconductor device of claim 7, further comprising an inverter.

9. The semiconductor device of claim 7, wherein the ESD trigger comprises a diode.

10. The semiconductor device of claim 1, further comprising a pad to which the ESD trigger and the ESD fingers are coupled.

11. A CMOS semiconductor electrostatic discharge (ESD) protection device having salicide to lower sheet resistance of a polysilicon resistor, and of sources and drains of MOS transistors, of the CMOS semiconductor ESD protection device, the CMOS semiconductor ESD protection device further comprising:

an ESD trigger having a first turn-on voltage and a first channel length; and, a plurality of ESD fingers having a second turn-on voltage greater than the first turn-on voltage, and a second channel length greater than the first channel length, such that the ESD fingers turn on substantially uniformly after the ESD trigger turns on during an ESD event, the semiconductor device substantially fabricated without employing salicide blocking.

12. The semiconductor device of claim 11, wherein the ESD trigger turns on the ESD fingers during the ESD event.

13. A CMOS semiconductor driver device having salicide to lower sheet resistance of a polysilicon resistor, and of sources and drains of MOS transistors, of the CMOS semiconductor device, the CMOS semiconductor driver device having electrostatic discharge (ESD) protection and further comprising:

an ESD trigger having a first turn-on voltage and a first channel length; and, a plurality of ESD fingers having a second turn-on voltage greater than the first turn-on voltage, and a second channel length greater than the first channel length, such that the ESD fingers turn on substantially uniformly after the ESD trigger turns on during an ESD event, the semiconductor device substantially fabricated without employing salicide blocking.

14. The semiconductor driver device of claim 13, further comprising an inverter, and wherein the ESD trigger comprises a diode.

15. The semiconductor driver device of claim 13, further comprising a pad to which the ESD trigger and the ESD fingers are coupled.

* * * * *